(12) United States Patent
Epler et al.

(10) Patent No.: US 11,695,099 B2
(45) Date of Patent: Jul. 4, 2023

(54) CONTACT FOR A SEMICONDUCTOR LIGHT EMITTING DEVICE

(75) Inventors: John E. Epler, San Jose, CA (US); Aurelien J. F. David, Palo Alto, CA (US)

(73) Assignee: Lumileds LLC, San Jose, CA (US)

(*) Notice: Subject to any disclaimer, the term of this patent is extended or adjusted under 35 U.S.C. 154(b) by 727 days.

(21) Appl. No.: 13/448,700

(22) Filed: Apr. 17, 2012

(65) Prior Publication Data

US 2012/0199863 A1  Aug. 9, 2012

Related U.S. Application Data

(62) Division of application No. 12/491,976, filed on Jun. 25, 2009, now abandoned.

(51) Int. Cl.
*H01L 33/42* (2010.01)
*H01L 33/40* (2010.01)

(52) U.S. Cl.
CPC ............ *H01L 33/42* (2013.01); *H01L 33/405* (2013.01)

(58) Field of Classification Search
CPC .............................. H01L 33/405; H01L 33/42
USPC ...................................................... 257/98, 99
See application file for complete search history.

(56) References Cited

U.S. PATENT DOCUMENTS

| | | | |
|---|---|---|---|
| 5,045,408 A * | 9/1991 | Williams | .............. H01L 29/452 257/734 |
| 5,272,108 A | 12/1993 | Kozawa | |
| 5,917,202 A | 6/1999 | Haitz et al. | |
| 6,008,539 A * | 12/1999 | Shibata | ............. H01L 21/28575 257/745 |
| 6,194,743 B1 | 2/2001 | Kondoh et al. | |
| 6,291,839 B1 * | 9/2001 | Lester | ..................... H01L 33/46 257/103 |
| 6,291,840 B1 * | 9/2001 | Uemura | .............. H01L 33/0095 257/103 |
| 6,303,405 B1 * | 10/2001 | Yoshida | ............ H01L 21/76251 257/E21.567 |

(Continued)

FOREIGN PATENT DOCUMENTS

CN   1677703 A    3/2005
CN   1877874 A   12/2006
(Continued)

OTHER PUBLICATIONS

Yamada et al., "InGaN-Based Near-Ultraviolet and Blue-Light-Emitting Diodes with High External Quantum Efficiency Using a Patterned Sapphire Substrate with a Mesh Electrode", Japanese Journal of Applied Physics 41 (2002) pp. L1431-L1433.*

(Continued)

*Primary Examiner* — Jay C Kim
(74) *Attorney, Agent, or Firm* — Volpe Koenig

(57) ABSTRACT

Embodiments of the invention include a semiconductor structure comprising a III-nitride light emitting layer disposed between an n-type region and a p-type region. A contact disposed on the p-type region includes a transparent conductive material in direct contact with the p-type region, a reflective metal layer, and a transparent insulating material disposed between the transparent conductive layer and the reflective metal layer. In a plurality of openings in the transparent insulating material, the transparent conductive material is in direct contact with the reflective metal layer.

7 Claims, 2 Drawing Sheets

(56) References Cited

U.S. PATENT DOCUMENTS

| | | | |
|---|---|---|---|
| 6,420,732 B1* | 7/2002 | Kung | H01L 33/145 257/79 |
| 6,441,403 B1* | 8/2002 | Chang | H01L 33/22 257/103 |
| 6,465,808 B2* | 10/2002 | Lin | H01L 33/387 257/81 |
| 6,512,248 B1* | 1/2003 | Takeuchi | H01L 33/38 257/81 |
| 6,514,782 B1 | 2/2003 | Wierer, Jr. et al. | |
| 6,547,249 B2* | 4/2003 | Collins, III | H01L 27/153 257/88 |
| 6,576,488 B2* | 6/2003 | Collins, III | C25D 13/02 438/29 |
| 6,657,236 B1* | 12/2003 | Thibeault | H01L 33/20 257/98 |
| 6,693,352 B1* | 2/2004 | Huang | H01L 29/452 257/743 |
| 6,748,001 B1* | 6/2004 | Nishitsuka | G11B 7/1275 372/23 |
| 6,784,010 B2* | 8/2004 | Yamaguchi | B82Y 20/00 438/39 |
| 6,784,462 B2 | 8/2004 | Schubert | |
| 6,794,690 B2 | 9/2004 | Uemura | |
| 6,797,987 B2* | 9/2004 | Chen | H01L 33/405 257/100 |
| 6,891,197 B2* | 5/2005 | Bhat | H01L 33/20 257/79 |
| 6,916,676 B2* | 7/2005 | Sano | B82Y 20/00 257/E33.068 |
| 6,946,372 B2* | 9/2005 | Kim | H01L 33/0095 257/13 |
| 6,946,685 B1* | 9/2005 | Steigerwald | H01L 33/405 257/488 |
| 6,990,132 B2* | 1/2006 | Kneissl | B82Y 20/00 372/45.01 |
| 6,998,649 B2* | 2/2006 | Hata | B82Y 20/00 257/745 |
| 7,009,218 B2* | 3/2006 | Sugimoto | H01L 21/28575 257/81 |
| 7,064,354 B2* | 6/2006 | Chen | H01L 25/0756 257/77 |
| 7,072,374 B2* | 7/2006 | Matsumura | H01S 5/22 372/43.01 |
| 7,166,483 B2* | 1/2007 | Liu | H01L 33/38 257/E33.068 |
| 7,173,311 B2* | 2/2007 | Sato | H01L 27/15 257/100 |
| 7,279,751 B2* | 10/2007 | Ueda | B82Y 20/00 257/347 |
| 7,291,865 B2* | 11/2007 | Kojima | H01L 33/405 257/78 |
| 7,294,864 B2* | 11/2007 | Kim | H01L 33/405 257/98 |
| 7,326,967 B2 | 2/2008 | Hsieh et al. | |
| 7,335,916 B2 | 2/2008 | Kim et al. | |
| 7,375,380 B2 | 5/2008 | Asahara et al. | |
| 7,406,111 B2* | 7/2008 | Sung | H01S 5/22 372/43.01 |
| 7,491,979 B2* | 2/2009 | Kwak | H01L 33/405 257/79 |
| 7,501,665 B2* | 3/2009 | Yasuda | H01L 33/10 257/98 |
| 7,512,167 B2* | 3/2009 | Izu | H01S 5/4025 372/36 |
| 7,557,379 B2* | 7/2009 | Haberern | H01L 33/405 257/79 |
| 7,569,432 B1* | 8/2009 | Chang | H01L 33/405 257/E21.053 |
| 7,576,367 B2* | 8/2009 | Sugimori | H01L 27/15 257/99 |
| 7,592,637 B2* | 9/2009 | Zimmerman | H01L 33/20 257/103 |
| 7,646,036 B2* | 1/2010 | Kozawa | H01L 33/405 257/99 |
| 7,646,798 B2* | 1/2010 | Michiue | B82Y 20/00 372/44.011 |
| 7,659,553 B2 | 2/2010 | Kato et al. | |
| 7,679,097 B2* | 3/2010 | Akaishi | H01L 33/38 257/79 |
| 7,683,381 B2* | 3/2010 | Hsu et al. | 257/81 |
| 7,687,323 B2 | 3/2010 | Matsuo et al. | |
| 7,724,321 B2* | 5/2010 | Hsieh | G02B 27/0927 349/106 |
| 7,732,231 B1* | 6/2010 | Aldaz | H01L 33/38 438/22 |
| 7,738,524 B2* | 6/2010 | Ochiai | B82Y 20/00 372/44.011 |
| 7,755,095 B2* | 7/2010 | Nagai | F21K 9/00 257/88 |
| 7,781,791 B2 | 8/2010 | Sakai et al. | |
| 7,791,101 B2* | 9/2010 | Bergmann | H01L 33/0079 257/103 |
| 7,847,312 B2* | 12/2010 | Fudeta | H01L 23/552 257/99 |
| 7,867,885 B2* | 1/2011 | Bae | H01L 33/20 257/571 |
| 7,871,840 B2* | 1/2011 | Nomaguchi | H01L 21/02164 257/E21.09 |
| 7,902,565 B2* | 3/2011 | Katsuno | H01L 33/405 257/98 |
| 7,915,629 B2* | 3/2011 | Li et al. | 257/98 |
| 7,915,636 B2* | 3/2011 | Lee | H01L 33/22 257/103 |
| 7,922,939 B2* | 4/2011 | Lewis | H01B 1/22 252/514 |
| 7,935,554 B2* | 5/2011 | Lee | H01L 21/0237 257/E21.219 |
| 7,952,106 B2* | 5/2011 | Hsu | H01L 33/382 257/13 |
| 7,973,325 B2 | 7/2011 | Kim et al. | |
| 7,981,704 B2* | 7/2011 | Abe | B82Y 20/00 257/98 |
| 7,982,236 B2 | 7/2011 | Sano et al. | |
| 7,985,979 B2* | 7/2011 | David | H01L 33/22 257/98 |
| 7,989,820 B2* | 8/2011 | Lee | H01L 33/0079 257/14 |
| 8,017,970 B2* | 9/2011 | Katsuno | H01L 33/40 257/E33.062 |
| 8,093,608 B2* | 1/2012 | Muramoto | H01L 33/405 257/79 |
| 8,101,964 B2* | 1/2012 | Kitagawa | H01L 33/38 257/99 |
| 8,115,222 B2* | 2/2012 | Matsui | H01L 33/40 257/98 |
| 8,120,049 B2* | 2/2012 | Matsuo | H01L 33/46 257/100 |
| 8,129,743 B2* | 3/2012 | Suehiro | H01L 33/486 257/100 |
| 8,138,518 B2* | 3/2012 | Tsai | H01L 33/14 257/100 |
| 8,143,643 B2* | 3/2012 | Choo | H01L 33/40 257/103 |
| 8,168,966 B2 | 5/2012 | Biwa et al. | |
| 8,174,037 B2 | 5/2012 | Edmond et al. | |
| 8,247,837 B2* | 8/2012 | Lin | H01L 33/44 257/100 |
| 8,368,100 B2* | 2/2013 | Donofrio | H01L 33/486 257/98 |
| 8,378,376 B2* | 2/2013 | Chung | H01L 33/405 257/99 |
| 8,525,129 B2* | 9/2013 | Offermans | B82Y 15/00 250/458.1 |
| 8,525,204 B2 | 9/2013 | Fukshima et al. | |
| 8,526,476 B2* | 9/2013 | Engl | H01L 33/405 257/98 |
| 8,530,923 B2 | 9/2013 | Sabathil et al. | |

(56) References Cited

U.S. PATENT DOCUMENTS

| | | | |
|---|---|---|---|
| 8,679,869 B2* | 3/2014 | Aldaz | H01L 33/0079 438/26 |
| 9,070,837 B2* | 6/2015 | Katsuno | H01L 33/38 |
| 9,246,073 B2* | 1/2016 | Sasaoka | H01L 24/29 |
| 9,508,902 B2* | 11/2016 | Ko | H01L 33/42 |
| 2002/0014630 A1* | 2/2002 | Okazaki | H01L 33/40 257/79 |
| 2003/0146445 A1* | 8/2003 | Hen | H01L 33/405 257/93 |
| 2004/0026702 A1* | 2/2004 | Yamada | H01L 33/40 257/80 |
| 2004/0038519 A1 | 2/2004 | Yanagisawa et al. | |
| 2005/0067625 A1* | 3/2005 | Hata | B82Y 20/00 257/81 |
| 2005/0072968 A1* | 4/2005 | Tsai | H01L 33/405 257/10 |
| 2005/0121685 A1* | 6/2005 | Seong | H01L 33/42 257/E33.068 |
| 2005/0156183 A1* | 7/2005 | Tsai | H01L 33/405 257/96 |
| 2005/0199895 A1 | 9/2005 | Seong | |
| 2006/0011925 A1 | 1/2006 | Bader et al. | |
| 2006/0046328 A1 | 3/2006 | Raffetto et al. | |
| 2006/0127567 A1 | 6/2006 | Uehara et al. | |
| 2006/0154389 A1 | 7/2006 | Doan | |
| 2006/0192223 A1* | 8/2006 | Lee | H01L 33/38 257/99 |
| 2006/0273335 A1 | 12/2006 | Asahara | |
| 2006/0273336 A1* | 12/2006 | Fujikura | H01L 33/42 257/98 |
| 2006/0289886 A1* | 12/2006 | Sakai | H01L 33/405 257/98 |
| 2007/0096130 A1* | 5/2007 | Schiaffino | H01L 33/382 257/98 |
| 2007/0102692 A1 | 5/2007 | Asahara et al. | |
| 2007/0145380 A1 | 6/2007 | Shum | |
| 2008/0048202 A1* | 2/2008 | Tazima | H01L 27/153 257/98 |
| 2008/0048206 A1* | 2/2008 | Lee | H01L 33/387 257/103 |
| 2008/0068821 A1 | 3/2008 | Wang et al. | |
| 2008/0185606 A1 | 8/2008 | Sano et al. | |
| 2008/0296602 A1* | 12/2008 | Liu | H01L 33/22 257/99 |
| 2008/0308832 A1* | 12/2008 | Hsieh | H01L 33/44 257/98 |
| 2009/0134418 A1* | 5/2009 | Lee | H01L 33/405 257/98 |
| 2010/0051978 A1* | 3/2010 | Katsuno | H01L 33/32 257/94 |
| 2010/0148190 A1 | 6/2010 | Kim et al. | |
| 2011/0140152 A1* | 6/2011 | Song | H01L 33/44 257/98 |

FOREIGN PATENT DOCUMENTS

| | | |
|---|---|---|
| CN | 101213678 A | 7/2008 |
| CN | 101355119 A | 1/2009 |
| DE | 102008035900 | 11/2009 |
| JP | 7131070 A2 | 5/1995 |
| JP | 09167859 A | 6/1997 |
| JP | 10209500 A2 | 8/1998 |
| JP | 11186599 A | 7/1999 |
| JP | 2002016286 A2 | 1/2002 |
| JP | 2003224297 A2 | 8/2003 |
| JP | 2005191219 A2 | 7/2005 |
| JP | 2005197289 A | 7/2005 |
| JP | 2006093358 A2 | 4/2006 |
| JP | 2007013045 A | 1/2007 |
| JP | 2008010608 A | 1/2008 |
| JP | 2009088299 A | 4/2009 |
| JP | 2009260316 A | 11/2009 |
| WO | 2006006555 A1 | 1/2006 |
| WO | 2006006822 A1 | 1/2006 |
| WO | 2007004701 A1 | 1/2007 |
| WO | 2009010762 A1 | 1/2009 |

OTHER PUBLICATIONS

Kim et al., "High-Reflectivity Al—Pt Nanostructured Ohmic Contact to p-GaN," IEEE Transactions On Electron Devices 53 Oct. 2006 pp. 2448-2453.*
Kim Hyunsoo et al., "Light Extraction Enhancement of GaN-based Light Emitting Diodes using MgF2/Al Omnidirectional Reflectors" Journal of Applied Physics 104, 053111(2008) p. 1-4.
D.J. Poxson et al., "Quantification of Porosity and Deposition Rate of Nanoporous Films Grown by Oblique Angle Deposition", Applied Journal of Physics Letters, 93, 101914 2008, p. 1-3.
EP Office Action for Application No. 10726287.5, dated Oct. 23, 2015, 5 pages.
First Office Action and Search Report for CN Application No. 201080028617.4, dated Aug. 6, 2014, 22 pages.
JP Office Action for Application No. 2012-516887, dated May 28, 2015, 14 pages.
Second Office Action for CN Application No. 201080028617.4, dated Mar. 17, 2015, 11 pages.
Third Office Action for CN Application No. 201080028617.4, dated Nov. 4, 2015, 13 pages.
TW Office Action for Application No. 099116193, dated Nov. 27, 2015, 9 pages.
WO International Search Report and Written Opinion dated Dec. 14, 2010, 12 pages.
10-2012-7001895 KR OA, Jan. 13, 2016, 10 pps.
JP Office Action, Application 2015-187919, dated Jun. 21, 2016, 5 pps.
KR Office Action, Application No. 10-2012-7001895, dated Jul. 30, 2016.
TW Office Action, Application 099116193, dated Jul. 6, 2016, 5 pps.
JP Office Action, Application 2015-187919, dated Jan. 17, 2017, 6 pps.

* cited by examiner

CONTACT FOR A SEMICONDUCTOR LIGHT EMITTING DEVICE

This application is a Divisional of U.S. patent application Ser. No. 12/491,976, filed 25 Jun. 2009.

FIELD INVENTION

The present invention relates to a reflective contact for a III-nitride light emitting device.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, composite, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions. III-nitride devices are often formed as inverted or flip chip devices, where both the n- and p-contacts formed on the same side of the semiconductor structure, and light is extracted from the side of the semiconductor structure opposite the contacts.

U.S. Pat. No. 6,514,782 describes III-nitride flip chip LEDs. "Because of the high resistivity of p-type III-nitride layers, LED designs employ metallization along the p-type layers to provide p-side current spreading . . . . For an inverted design, using highly reflective electrode metallizations is critical to improve the extraction efficiency . . . . The p electrode is the dominant factor for light extraction because it extends almost completely across the active area to provide uniform current injection into the p-n junction.

"The combination of low optical absorption and low contact resistivity in a manufacturable process are difficult to achieve for III-nitride devices. For example, Ag makes a good p-type Ohmic contact and is very reflective, but suffers from poor adhesion to III-nitride layers and from susceptibility to electro-migration in humid environments which can lead to catastrophic device failure. Al is reasonably reflective but does not make good Ohmic contact to p-type III-nitride materials, while other elemental metals are fairly absorbing (>25% absorption per pass in the visible wavelength regime). A possible solution is to use a multi-layer contact which includes a very thin semi-transparent Ohmic contact in conjunction with a thick reflective layer which acts as a current spreading layer. An optional barrier layer is included between the Ohmic layer and the reflective layer. One example of a p-type multi-layer contact is Au/NiO$_x$/Al. Typical thicknesses for this metallization scheme are 30/100/1500 Å, Similarly, a suitable n-type GaN multi-layer contact is Ti/Al with typical thicknesses of 30/1500 Å, Since the p-electrode reflectivity is a dominant factor in extraction efficiency, it must not be compromised in designing for manufacturability."

SUMMARY

It is an object of the present invention to include in a reflective contact a thin, transparent current spreading layer and a transparent insulating material. In some embodiments, reflectivity of the contact may be improved over a device with a reflective metal contact.

Embodiments of the invention include a semiconductor structure comprising a III-nitride light emitting layer disposed between an n-type region and a p-type region. A contact disposed on the p-type region includes a transparent conductive material in direct contact with the p-type region, a reflective metal layer, and a transparent insulating material disposed between the transparent conductive layer and the reflective metal layer. In a plurality of openings in the transparent insulating material, the transparent conductive material is in direct contact with the reflective metal layer.

DETAILED DESCRIPTION

The performance of an LED may be improved by reducing optical loss associated with the p-contact, without increasing the forward voltage $V_f$ required to forward bias the LED. A contact including a dielectric layer, which reflects by total internal reflection, may be more reflective than a contact where the sole reflective material is a metal reflector, such as the contacts described above in U.S. Pat. No. 6,514,782.

A conductive dielectric layer such as indium tin oxide (ITO) may be disposed between the p-type material and the silver p-contact. In such a bilayer, the ITO need not contribute to current spreading and the thickness may be optimized for highest reflectance; for example, the ITO may be 200 nm thick. However, ITO has an index of refraction higher than optimum for optical reflectivity and may absorb a significant amount of light at thicknesses required for high conductivity.

Alternatively, a nonconductive dielectric such as SiO2 may be disposed between the p-type material and the silver p-contact. Openings must be formed in the nonconductive dielectric to electrically connect the silver to the p-type material. The openings must be spaced close enough together to prevent current crowding in the poorly conductive p-type material. For example, the openings may be sub-micron size, which may require expensive and difficult techniques such as holographic or e-beam exposure of resist, or the use of a nano-imprinting tool. In addition, etching openings in the dielectric may damage the exposed p-type material, which may reduce the efficiency of an Ohmic contact formed on the damaged material.

In embodiments of the invention, the p-contact of a III-nitride LED includes three layers: a thin conductive layer in direct contact with the p-type semiconductor, a low-optical-loss dielectric layer disposed over the thin conductive layer with openings to facilitate electrical contact, and a reflective metal layer over the transparent dielectric layer.

Figure 1:
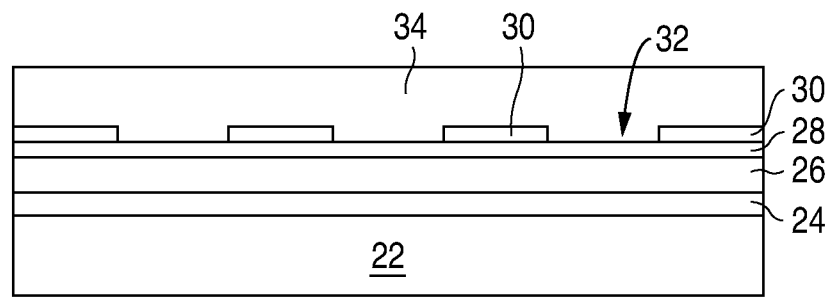
FIG. 1 illustrates a contact including a conductive layer, a transparent insulating or low-loss layer, and a reflective layer, formed on a III-nitride semiconductor structure.

FIG. 1 illustrates a portion of a III-nitride device according to embodiments of the invention. In FIG. 1, a semiconductor structure including an n-type region, a light emitting or active region, and a p-type region is grown over a growth substrate (not shown in FIG. 1), which may be any suitable growth substrate and which is typically sapphire or SiC. An n-type region 22 is grown first over the substrate. N-type region 22 may include multiple layers of different compositions and dopant concentration including, for example, preparation layers such as buffer layers or nucleation layers, which may be n-type or not intentionally doped, release layers designed to facilitate later release of the growth substrate or thinning of the semiconductor structure after substrate removal, and n- or even p-type device layers designed for particular optical or electrical properties desirable for the light emitting region to efficiently emit light.

A light emitting or active region 24 is grown over n-type region 22. Examples of suitable light emitting regions include a single thick or thin light emitting layer, or a multiple quantum well light emitting region including multiple thin or thick quantum well light emitting layers separated by barrier layers. For example, a multiple quantum well light emitting region may include multiple light emitting layers, each with a thickness of 25 Å or less, separated by barriers, each with a thickness of 100 Å or less. In some embodiments, the thickness of each of the light emitting layers in the device is thicker than 50 Å.

A p-type region 26 is grown over light emitting region 24. Like the n-type region, the p-type region may include multiple layers of different composition, thickness, and dopant concentration, including layers that are not intentionally doped, or n-type layers.

A thin conductive layer 28 is formed over p-type region 26. Thin conductive layer 28 may be, for example, silver, aluminum, or a conductive dielectric such as ITO, nickel oxide, ZnO or any other suitable semitransparent conductive material. A silver conductive layer 28 may be, for example, between 0.5 and 2 nm thick in some embodiments, between 2 and 8 nm thick in some embodiments, and 10 nm thick in some embodiments. A conductive layer 28 that is a transparent conductive oxide may be thicker. For example, the resistivity of an ITO conductive layer 28 may be 100 times greater than silver, requiring an ITO conductive layer 28 that is 100 times thicker than a silver conductive layer 28. To spread current several microns may require, for example, an ITO conductive layer 28 that is 200 nm thick. The material and thickness of conductive layer 28 may be selected such that current spreads in conductive layer 28 for 10 microns, for example.

Figure 5A:
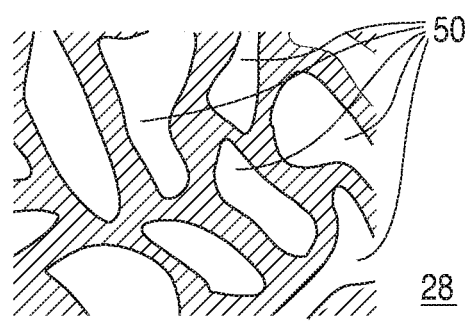
FIGS. 5A, 5B illustrate example conductive material comprising a plurality of discrete regions.
Figure 5B:
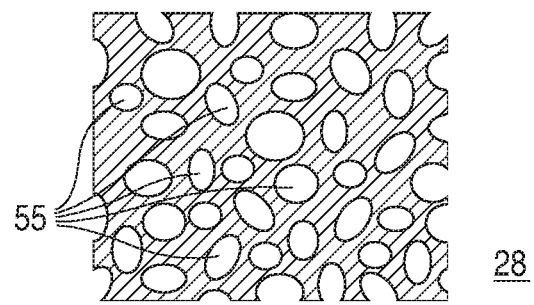

In some embodiments, thin conductive layer 28 is formed as a group of small regions, rather than as a single, uninterrupted, continuous layer. In some embodiments, a thin layer of silver is evaporated on the surface of the p-type region 26, then annealed. During the anneal, the silver tends to agglomerate from a continuous, planar layer into a network of thicker, discrete regions, such as regions 50 in FIG. 5A. For example, ten Angstroms of silver may be evaporated on to the p-type region 26. After annealing, the silver regions may be, for example, about 200 Angstroms long and about 200 Angstroms thick. The silver regions may be, for example, up to 1 micron apart in some embodiments and up to 500 nm apart in some embodiments, such that less than 10% of the surface of the p-type region 26 is covered with silver in some embodiments. In some embodiments, a planar thin conductive layer 28 may be formed, then etched to form a group of small regions, such as regions 55 in FIG. 5B. In some embodiments, during silver deposition the structure is heated to encourage migration and agglomeration of silver into a network of thicker, discrete regions.

A low optical loss material 30 is formed over conductive layer 28. Low-loss material 30 may be, for example, $SiO_x$, $SiN_x$, $MgF_2$, $Al_2O_3$, or any other suitable highly transparent dielectric that is reflective, manufacturable, and readily adheres to the conductive layer 28. In some embodiments, low-loss material 30 has a low index of refraction, so the change in index of refraction between the low-loss material and the conductive layer 28 and p-type region 26 is as large as possible. Low-loss material 30 may be, for example, between 200 and 500 nm thick in some embodiments, between 250 and 350 nm thick in some embodiments, and 250 nm thick in some embodiments.

Figure 2:
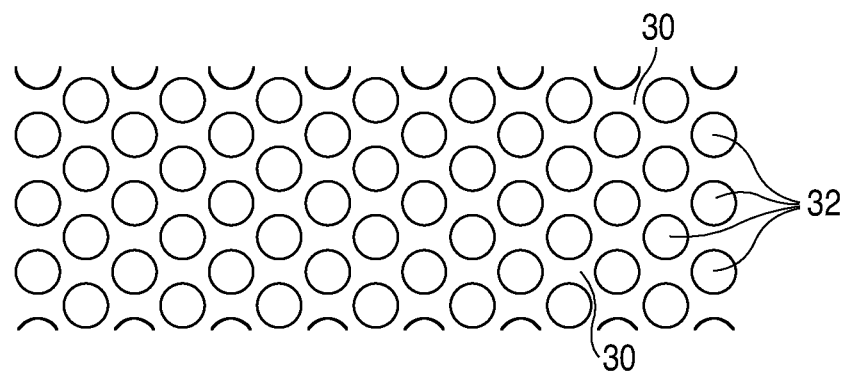
FIG. 2 is a plan view of a portion of a contact including a low-loss layer with openings.

Openings 32 are then formed in the low-loss material 30, for example by conventional masking and etching steps. In some embodiments, endpoint detection is used to avoid etching the underlying conductive layer 28. In some embodiments, the low-loss material 30 is etched to near the endpoint with a dry etch, then a wet etch is used to etch the remaining thickness. FIG. 2 is a plan view of the structure of FIG. 1 after forming openings 32 in low-loss material 30. Though round openings formed in a triangular lattice are illustrated, any suitably-shaped openings in any suitable lattice may be used. Openings 32 may be, for example, less than 100 microns in diameter in some embodiments, between 1 and 5 microns in diameter in some embodiments, between 2 and 15 microns in diameter in some embodiments, between 2 and 4 microns in diameter in some embodiments, and 3 microns in diameter in some embodiments. The openings may be spaced, for example, between 20 and 200 microns apart, on centers between 5 and 20 microns apart in some embodiments, between 10 and 15 microns apart in some embodiments, 6 microns apart in some embodiments, and 12 microns apart in some embodiments.

The size and spacing of the openings may be related to the resistivity and thickness of conductive layer 28. For example, a 150 nm thick layer of ITO has about the same sheet resistance as a 2 micron thick layer of n-GaN. In a device with a conventional contact formed on n-GaN, nearest neighbor n-contacts may be spaced about 150 microns apart. Accordingly, in a device according to embodiments of the invention with a 150 nm thick ITO conductive layer 28, the distance between openings 32 may be 150 microns. In a device according to embodiments of the invention with a 30 nm thick ITO conductive layer 28, the distance between openings 32 may be 30 microns. If the openings 32 are 3 microns in diameter spaced 30 microns apart, the surface coverage of openings 32 is about 1%.

The thickness of conductive layer 28 and low-loss material 30 depend on the individual materials used, as well as on the combination of materials.

A reflective conductive layer 34 is formed over the remaining low-loss material 30 and openings 32. Reflective layer 34 electrically connects to the p-type region 26 through openings 32 and conductive layer 28. Reflective layer 34 may be, for example, silver. Reflective layer 34 may be a multi-layer stack and may include, for example, one or more reflective metals, on or more Ohmic contact metals, and one or more guard metals or other guard materials. One example of a reflective layer 34 is a stack of silver, nickel, silver, then a guard metal such as TiWN, which may prevent or reduce electromigration of the silver.

The light extraction and hence performance of the LED may be improved by adding lossless scattering to the contact. In some embodiments, p-type region 26 is grown under conditions which create a rough surface, which may improve scattering over a smooth surface. Conductive layer 28 may be formed over the rough surface as a conformal layer, which would therefore also have a rough surface. A transparent low-loss layer 30 is then formed, for example by spin-coating, to cover the roughness and create a smooth surface. Openings are formed in the low-loss material and a reflective layer 34 is then formed, as described above. The roughness of the p-type region 26/conductive layer 28 interface may cause increased loss as compared to a smooth interface, but increased extraction may result in an overall improved performance. In some embodiments, scattering is increased by making low-loss layer 30 and/or conductive layer 28 porous or columnar in structure, for example by forming an ITO conductive layer 28 and/or a $SiO_x$ low-loss layer by oblique-angle deposition. The increase in porosity is accompanied by a reduction in refractive index which increases the reflectance of the contact. The porosity may be controlled by controlling the deposition angle, as described in "Quantification of porosity and deposition rate of nanoporous films grown by oblique-angle deposition," Applied Physics Letters 93, 101914 (2008), which is incorporated herein by reference.

In one example, an Al-doped ZnO conductive layer 28 is applied to a rough p-type GaN layer grown as the top layer of the p-type region 26. A low index $SiO_x$ layer 30 is spin-coated over the ZnO to provide scattering at the ZnO/SiOx interface and to planarize the rough ZnO layer. Openings 32 are formed, then a silver reflective layer 34 is deposited.

In some embodiments, low-loss material 30 is a multi-layer dielectric stack. The layers closest to the conductive layer 28 and the reflective layer 34 are chosen for good adhesion. The inner layers are chosen for minimum refractive index. Multiple layers may be formed, for example, in a single processing step. A multi-layer low-loss structure 30 may be more reliable and more reflective than a single layer. In addition, the difference in index of refraction between the layers in a multi-layer stack may provide scattering, particularly when a multi-layer stack is applied to a rough surface, as described above.

Figure 4A:
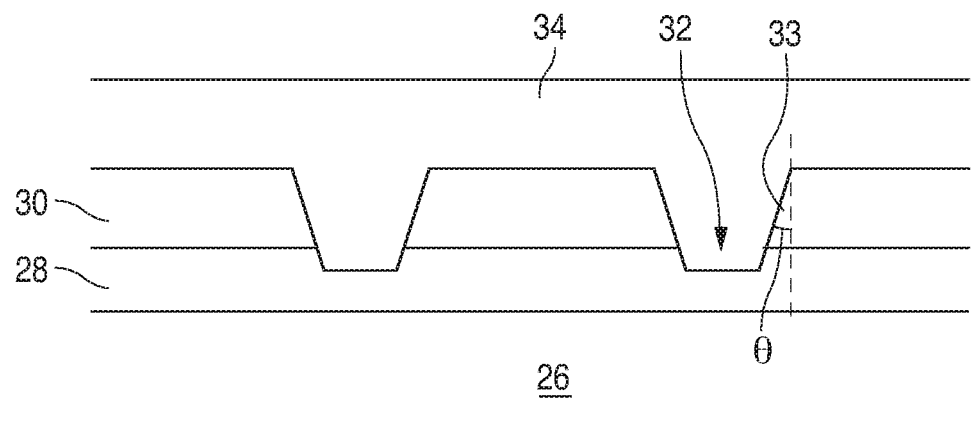
FIGS. 4A and 4B illustrate a contact with openings in the transparent insulating material that extend into the transparent conductive material, and have angled sidewalls.
Figure 4B:
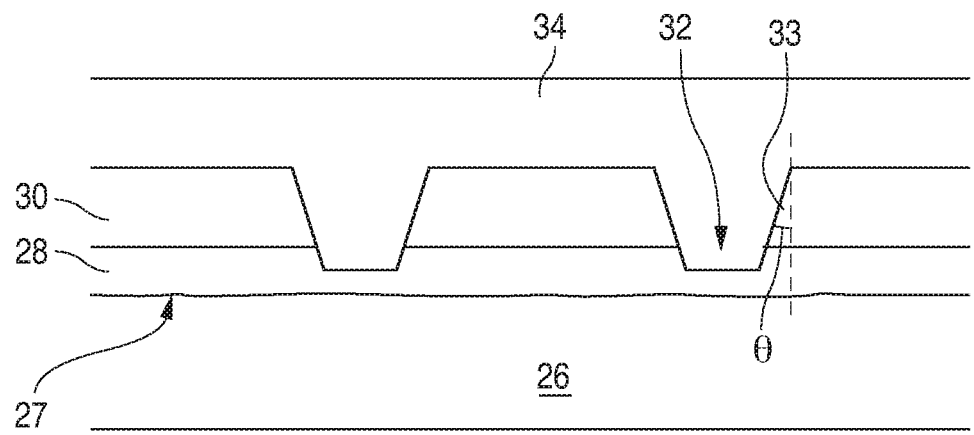

In some embodiments, the etch depth of the openings 32 in the low-loss material 30 is increased to include removal of some of the underlying conductive layer 28, as illustrated in FIGS. 4A and 4B, which may improve the electrical contact and may increase scattering. In some embodiments, the sidewalls 33 of openings 32 are angled to provide for more optimal scattering of high angle light towards the extraction surface (i.e. the surface of the device opposite reflective material 34). The sidewall angle θ may be, for example, between 5 and 50 degrees with respect to the surface normal. As noted above, the surface 27 of the P-type region 26 may be rough, as illustrated in FIG. 4B, which may further increase the scattering.

Figure 3:
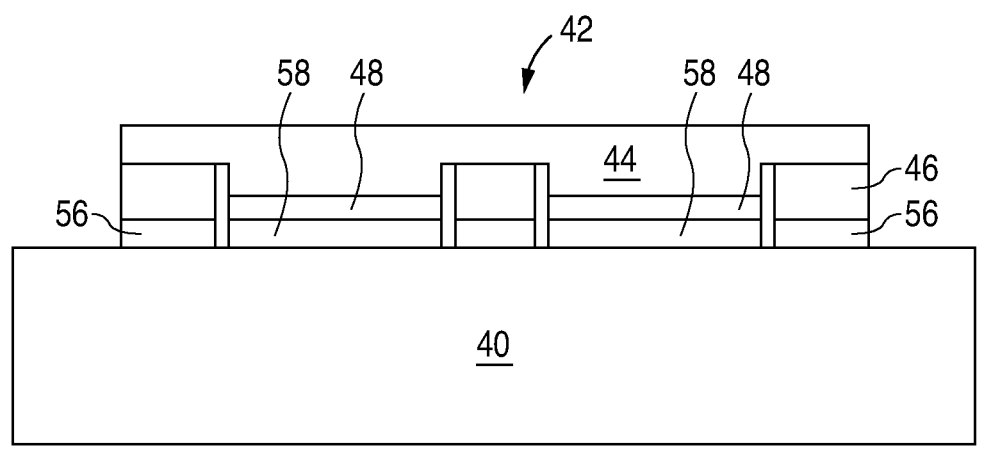
FIG. 3 is a cross sectional view of an LED bonded to a mount.

FIG. 3 illustrates an LED 42 connected to a mount 40. Before or after forming the p-contact 48, which includes conductive layer 28, low material 30 and reflective material 34, as described above, portions of the n-type region are exposed by etching away portions of the p-type region and the light emitting region. The semiconductor structure, including the n-type region 22, light emitting region 24, and p-type region 26 is represented by structure 44 in FIG. 3. N-contact 46 is formed on the exposed portions of the n-type region.

LED 42 is bonded to mount 40 by n- and p-interconnects 56 and 58. Interconnects 56 and 58 may be any suitable material, such as solder or other metals, and may include multiple layers of materials. In some embodiments, interconnects include at least one gold layer and the bond between LED 42 and mount 40 is formed by ultrasonic bonding.

During ultrasonic bonding, the LED die 42 is positioned on a mount 40. A bond head is positioned on the top surface of the LED die, often the top surface of a sapphire growth substrate in the case of a III-nitride device grown on sapphire. The bond head is connected to an ultrasonic transducer. The ultrasonic transducer may be, for example, a stack of lead zirconate titanate (PZT) layers. When a voltage is applied to the transducer at a frequency that causes the system to resonate harmonically (often a frequency on the order of tens or hundreds of kHz), the transducer begins to vibrate, which in turn causes the bond head and the LED die to vibrate, often at an amplitude on the order of microns. The vibration causes atoms in the metal lattice of a structure on the LED 42 to interdiffuse with a structure on mount 40, resulting in a metallurgically continuous joint. Heat and/or pressure may be added during bonding.

After bonding LED die 42 to mount 40, the growth substrate on which the semiconductor layers were grown may be removed, for example by laser lift off, etching, or any other technique suitable to a particular growth substrate. After removing the growth substrate, the semiconductor structure may be thinned, for example by photoelectrochemical etching, and/or the surface may be roughened or patterned, for example with a photonic crystal structure. A lens, wavelength converting material, or other structure known in the art may be disposed over LED 42 after substrate removal.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
    a semiconductor structure comprising a light emitting layer between an n-type region and a p-type region; and
    a contact on a surface of the p-type region that is opposite the light emitting layer, the contact including:
        a silver conductive layer comprising a plurality of round isolated islands that are spaced up to 1 micron apart, each of the plurality of round isolated islands is in direct electrical contact with the surface of the p-type region that is opposite the light emitting layer,
        a metal layer,
        a low loss material directly between the silver conductive layer and the metal layer, and
        a plurality of openings in the low loss material, portions of the metal layer extending through the plurality of openings in the low loss material and in direct contact with one or more of the plurality of round isolated islands of the silver conductive layer.

2. The device of claim 1, wherein the silver conductive layer includes annealed silver.

3. The device of claim 1, wherein the low loss material includes a plurality of discrete layers.

4. The device of claim 1, wherein the plurality of openings include openings with sloped walls having a sidewall angle between 5 and 50 degrees with respect to a normal to the surface of the p-type region that is opposite the light emitting layer.

5. The device of claim 1, wherein the low loss material comprises a transparent dielectric material.

6. The device of claim 1, wherein the low loss material comprises at least one of $SiO_x$, $SiN_x$, $MgF_2$, and $Al_2O_3$.

7. The device of claim 1, wherein:
the one or more of the plurality of round isolated islands that are in direct contact with the metal layer form a subset of the plurality of round isolated islands
the low loss material is formed over a remainder of the plurality of round isolated islands that are not included in the subset conductive layer.

* * * * *